United States Patent [19]

Clark

[11] Patent Number: 5,849,125

[45] Date of Patent: Dec. 15, 1998

[54] METHOD OF MANUFACTURING FLEXTENSIONAL TRANSDUCER USING PRE-CURVED PIEZOELECTRIC CERAMIC LAYER

[76] Inventor: Stephen E. Clark, 1344 Monterey Ave., Norfolk, Va. 23508

[21] Appl. No.: 797,596

[22] Filed: Feb. 7, 1997

[51] Int. Cl.[6] .................................................. H01L 41/22
[52] U.S. Cl. .......................... 156/222; 29/25.35; 264/229; 310/330
[58] Field of Search .......................... 29/25.35; 264/229; 156/84, 85, 160, 196, 221, 222; 310/311, 330, 328

[56] References Cited

U.S. PATENT DOCUMENTS

| | | | |
|---|---|---|---|
| 2,447,061 | 8/1948 | Franklin | 310/25.35 |
| 3,192,420 | 6/1965 | Cowan | 310/358 |
| 3,202,736 | 8/1965 | Horan et al. | 264/619 |
| 3,666,979 | 5/1972 | McElroy | 310/348 |
| 5,407,519 | 4/1995 | Joffe et al. | 156/358 |
| 5,471,721 | 12/1995 | Haertling | 29/25.35 |
| 5,632,841 | 5/1997 | Hellbaum et al. | 156/245 |

Primary Examiner—Francis J. Lorin
Attorney, Agent, or Firm—Stephen E. Clark

[57] ABSTRACT

A method for manufacturing pre-stressed piezoelectric actuators using a pre-curved piece of ceramic is provided. An adhesive, preferably a polyimide, is disposed between a metal pre-stress metal layer and a pre-curved PZT ceramic. The entire composite structure is heated to a temperature above the melting point of the adhesive material and then subsequently cooled to allow the adhesive layer to set. As a result of the difference in thermal contraction rates of the materials, the pre-curved PZT ceramic is compressively stressed. This pre-stressing provides a piezoelectric actuator which is durable, and produces a higher displacement than a conventional piezoelectric actuator.

16 Claims, 6 Drawing Sheets

METHOD OF MANUFACTURING FLEXTENSIONAL TRANSDUCER USING PRE-CURVED PIEZOELECTRIC CERAMIC LAYER

BACKGROUND OF THE INVENTION

1. Field of Invention

The present invention generally relates to electrically active ceramic devices and, more particularly, to a method for making a high deformation flextensional piezoelectric transducer using a pre-curved piezoelectric ceramic layer.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field.

A typical prior ceramic device such as a direct mode actuator makes direct use of a change in the dimensions of the material, when activated, without amplification of the actual displacement. Direct mode actuators typically include a piezoelectric or electrostrictive ceramic plate sandwiched between a pair of electrodes formed on its major surfaces. The device is generally formed of a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent.

Indirect mode actuators are known in the prior art to provide greater displacement than is achievable with direct mode actuators. Indirect mode actuators achieve strain amplification via external structures. An example of an indirect mode actuator is a flextensional transducer. Prior flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater displacement than can be produced by direct mode actuators.

The magnitude of the strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10% but can only sustain loads which are less than one pound. A conventional bimorph device includes an intermediate flexible metal foil sandwiched between two piezoelectric elements. Electrodes are bonded to each of the major surface of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20% (i.e. about twice that of unimorphs), but, like unimorphs, typically can only sustain loads which are less than one pound.

A unimorph actuator called "THUNDER", which has improved displacement and load capabilities, has recently been developed. THUNDER (which is an acronym for THin layer composite UNimorph ferroelectric Driver and sEnsoR), is a unimorph actuator in which a pre-stress layer is bonded to a thin piezoelectric ceramic wafer at high temperature, and during the cooling down of the composite structure asymmetrically stress biases the ceramic wafer due to the difference in thermal contraction rates of the pre-stress layer and the ceramic layer.

The construction of a THUNDER actuator 12 is illustrated in FIG. 1. A PZT piezoelectric ceramic layer 67 which is electroplated 65 and 65a on its two major faces is adhered to a metal pre-stress layer 64 by an adhesive layer 66. The adhesive layer 66 is preferably LaRC-SI™ material, a polyimide developed by NASA-Langley Research Center and commercially marketed by IMITEC, Inc. of Schenectady, N.Y. During manufacture of the THUNDER actuator 12 the ceramic layer 67, the adhesive layer 66 and the pre-stress layer 64 are simultaneously heated to a temperature above the melting point of the adhesive material, and then subsequently allowed to cool, thereby re-solidifying and setting the adhesive layer 66. During the cooling process the ceramic layer 67 becomes compressively stressed, due to the higher coefficient of thermal contraction of the material of the pre-stress layer 64 than for the material of the ceramic layer 67. Also, due to the greater thermal contraction of the laminate materials (e.g. the pre-stress layer 64 and the adhesive layer 66) than that of the ceramic layer 67, the ceramic layer deforms in an arcuate shape-having a normally concave face 12a and a normally convex face 12c, as illustrated in FIG. 1. The THUNDER actuator 12 may be energized by an electric power supply 22 via a pair of electrical wires 26 which are in communication with the electroplated 65 and 65a faces of the ceramic layer 67.

It will be appreciated from the preceding overview of that in order to provide a piezoelectric or electrostrictive transducer capable of developing the greatest (axial) displacement when energized, it is desirable to construct a flextensional device which is pre-stressed and in an arcuate shape.

As mentioned above in the prior art teaches that THUNDER actuators are capable of developing the greatest displacement when energized of all prior piezoelectric and electrostrictive transducers. However, because of the manner in which prior THUNDER actuators are manufactured, they are necessarily limited as to the amount of curvature which they can assume, and, therefore, the amount of (axial) displacement which they are capable of achieving.

Prior THUNDER actuators are manufactured by first selecting a mold having an arcuate shape, and then stacking an initially flat PZT ceramic layer, an adhesive layer, and an initially flat pre-stress metallic layer against the mold. External pressure is applied to the stacked layers in order to cause them to conform to take arcuate shape of the mold. The assembly is heated until the adhesive becomes molten, and then allowed to cool down. As the composite structure cools down, the external pressure is removed and the device is allowed to assume a more curved shape as the cooling pre-stress layer (and adhesive) compressively stresses ceramic layer.

In the prior art, the ceramic layer which is used to manufacture such devices is always a flat element, typically of rectangular cross-section, having two major surfaces. In addition, in the prior art, the ceramic layer is typically very thin (i.e. a millimeter thick or less). Also, as is well known, PZT ceramic is extremely brittle. Due to these properties of the ceramic elements used in prior devices, the ceramic layers are frequently fractured during the manufacturing of THUNDER actuators when the external pressure is applied to the ceramic layer in order to cause it to conform to the arcuate shape of the mold. In any event, in order to avoid breaking the brittle ceramic layer during manufacture of THUNDER actuators, it has been the practice in the prior art to minimize the curvature of the mold and, therefore, the degree to which the ceramic element is curved prior to bonding the adhesive and pre-stress layers to it.

Accordingly, it would be desirable to provide a method of manufacturing a pre-stressed, curved, flextensional piezoelectric actuator, having many of the characteristics to prior THUNDER actuators, but which does not subject the ceramic layer to potentially damaging external forces.

SUMMARY OF THE INVENTION

In view of the foregoing disadvantages inherent in the known types of piezoelectric actuators and methods for manufacturing same now present in the prior art, the present invention provides a method for manufacturing a piezoelectric actuator designed to maximize output potential due to pre-stressing, which avoids exposing the actuator components to potentially damaging external forces during the manufacturing process. The ceramic layer used in the present invention is advantageously constructed of an initially curved, unstressed element. As such, the general purpose of the present invention is to provide a method of manufacturing a high deformation piezoelectric actuator which improves on the prior art.

As will be described more fully herein below, in the preferred embodiment of the invention the pre-curved piezoelectric actuator is manufactured by first selecting a curved mold. A pre-stressing layer, preferably made of a metal, is then placed on the mold. A pre-stressing adhesive layer is then disposed on the first pre-stress layer. Next, a pre-curved, electroplated PZT ceramic layer having the same curvature as that of the mold is disposed on the first two layers. An external force may be applied in order to cause the adhesive and pre-stress layer to conform to the shape of the mold. The layers are then bonded together by heating the device to a temperature greater than the melting point of the adhesive and then allowing the composite structure to cool. During the cooling process the pre-stress layer imposes a compressive stress upon the ceramic layer and thereby changes the radius of curvature of the composite structure.

The actuator thus manufactured is capable of deformation, when energized, greater than that of prior piezoelectric actuators.

Accordingly, it is an object of the present invention to provide a method of manufacturing a high deformation piezoelectric ceramic actuator which improves upon the prior art.

It is another object of the present invention to provide a manufacturing process of the character described which produces a high deformation actuator having improved mechanical displacement.

It is another object of the present invention to provide a method of manufacturing a high deformation actuator which is relatively simple as contrasted with the prior art.

It is another object of the present invention to provide a manufacturing process of the character described which produces a high deformation actuator which does not expose the ceramic layer to potentially damaging external forces.

It is another object of the present invention to provide a manufacturing process of the character described which produces a high deformation actuator having improved durability compared to the prior art.

It is another object of the present invention to provide a manufacturing process of the character described which produces a high deformation actuator which is of an extremely simple and inexpensive design.

Further objects and advantages of this invention will become apparent from a consideration of the drawings and ensuing description thereof.

DESCRIPTION OF THE PREFERRED EMBODIMENTS

Figure 9:
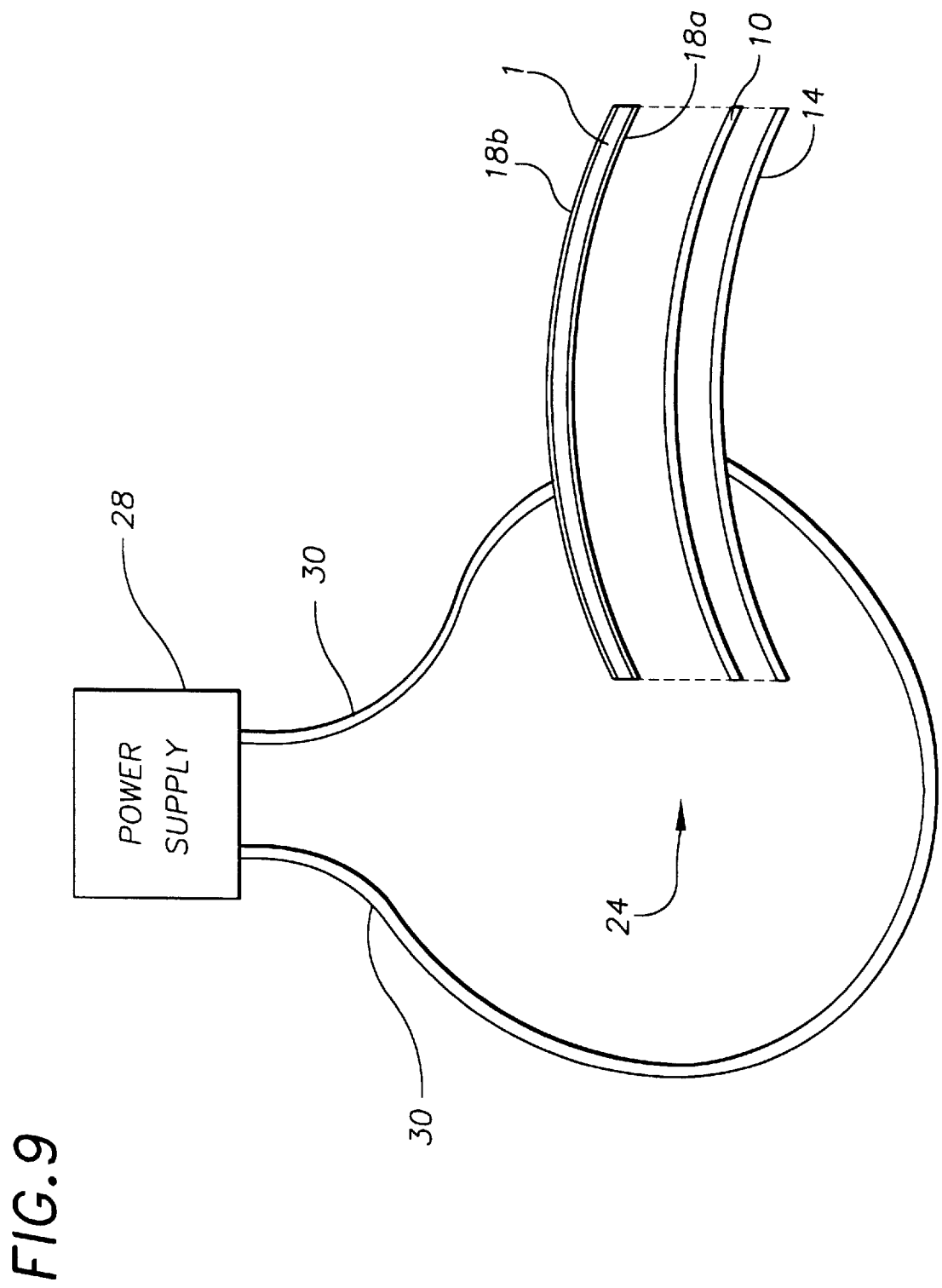
FIG. 9 is a side view showing an actuator constructed using the preferred the manufacturing process; and, FIG. 10 is a side view showing an actuator constructed using the modified manufacturing process shown in FIG. 8.

With initial reference directed toward FIG. 9 of the appended drawings, a pre-stressed high deformation piezoelectric actuator (generally designated by the reference numeral 24) manufactured embodying the principles and concepts of the present invention will be described.

As will be described more fully herein below, the preferred embodiment of the present invention is a method of manufacturing a high deformation actuator 24 by using an initially pre-curved PZT piezoelectric ceramic layer 1 having an electrode 18a and 18b on each of its two major surfaces 1a and 1b, an adhesive layer 10 and an initially flat pre-stress layer 14.

Figure 1:
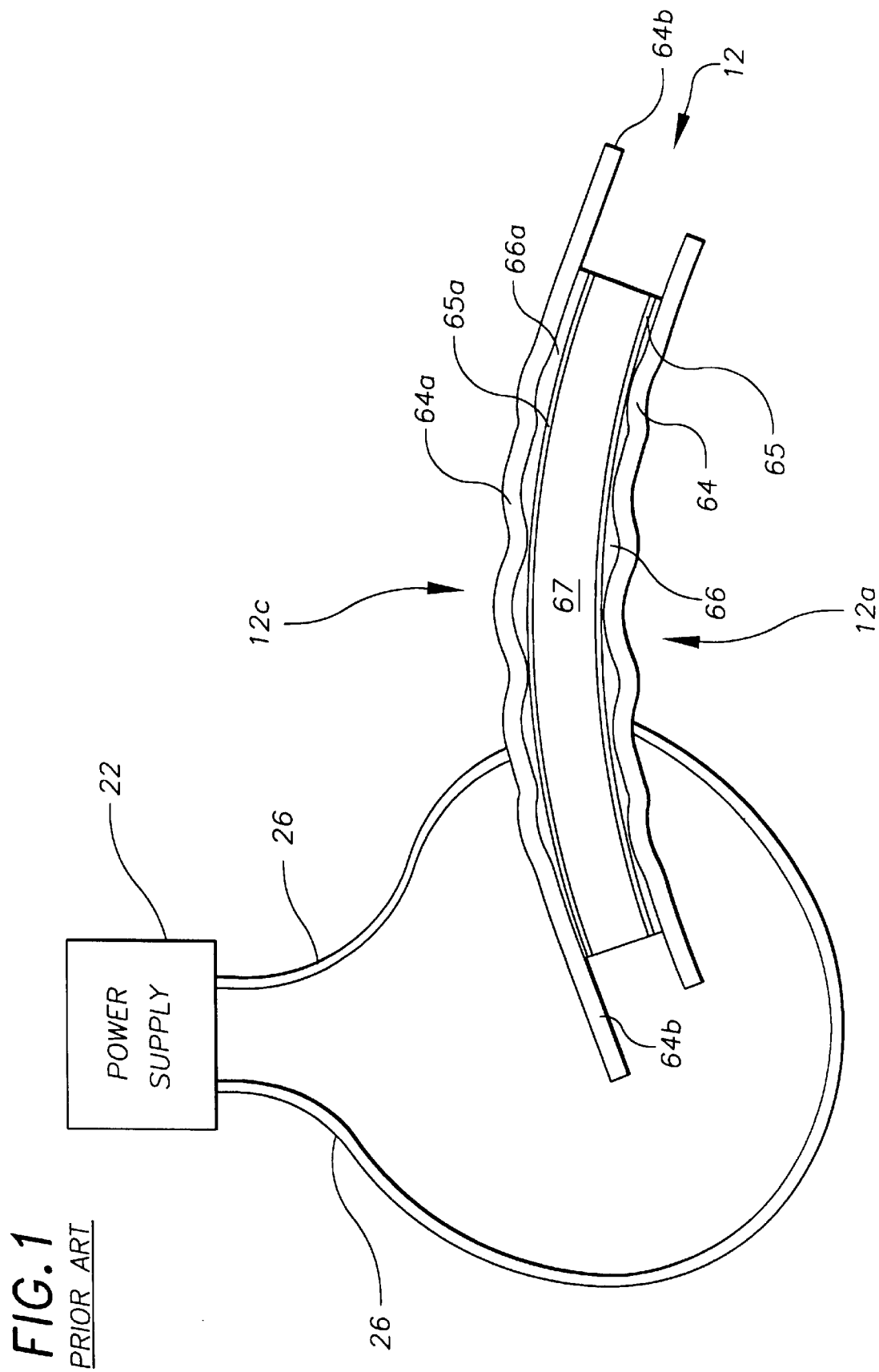
FIG. 1 is a side elevation of a prior THUNDER actuator (prior art)
Figure 2:
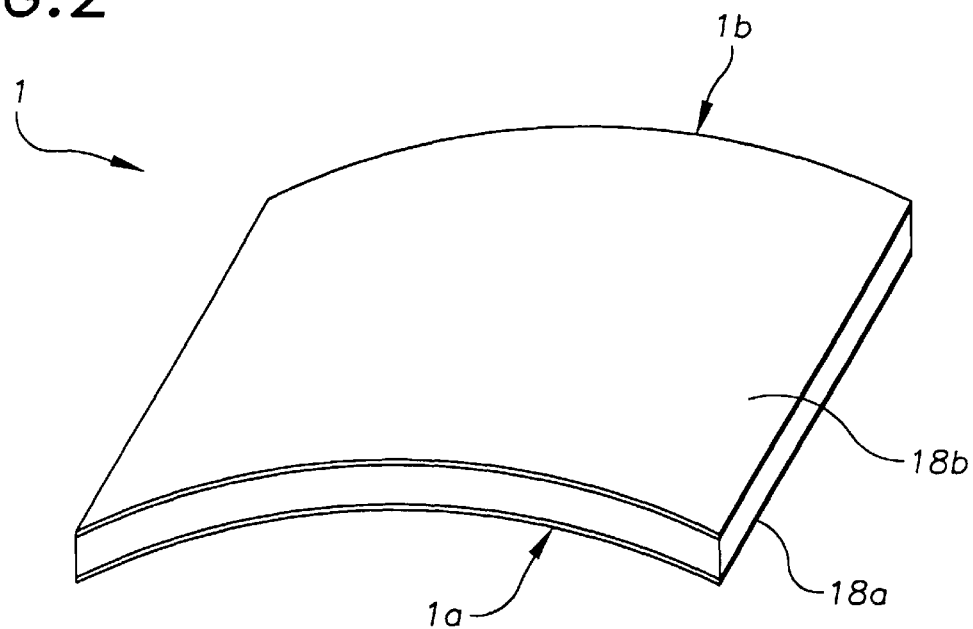
FIG. 2 is an isometric view of a pre-curved ceramic element used in the present invention.

As illustrated in FIG. 1, the ceramic layer 1 which is used in accordance with the present invention is preferably a PZT piezoelectric ceramic which is cast, machined, molded or otherwise produced so as to provide a normally unstressed piezoelectric ceramic layer 1 which is normally curved and normally unstressed. In the preferred embodiment of the invention the ceramic layer 1 has a substantially rectangular shape as viewed perpendicular to either of the major surfaces 1a or 1b, and is pre-curved in only one plane, as illustrated in the figures. However, it is within the scope of the present invention to employ a circular shaped ceramic layer, as viewed perpendicular to either of its two major surfaces, which is initially pre-curved so as to be "dome-shaped".

Figure 3:
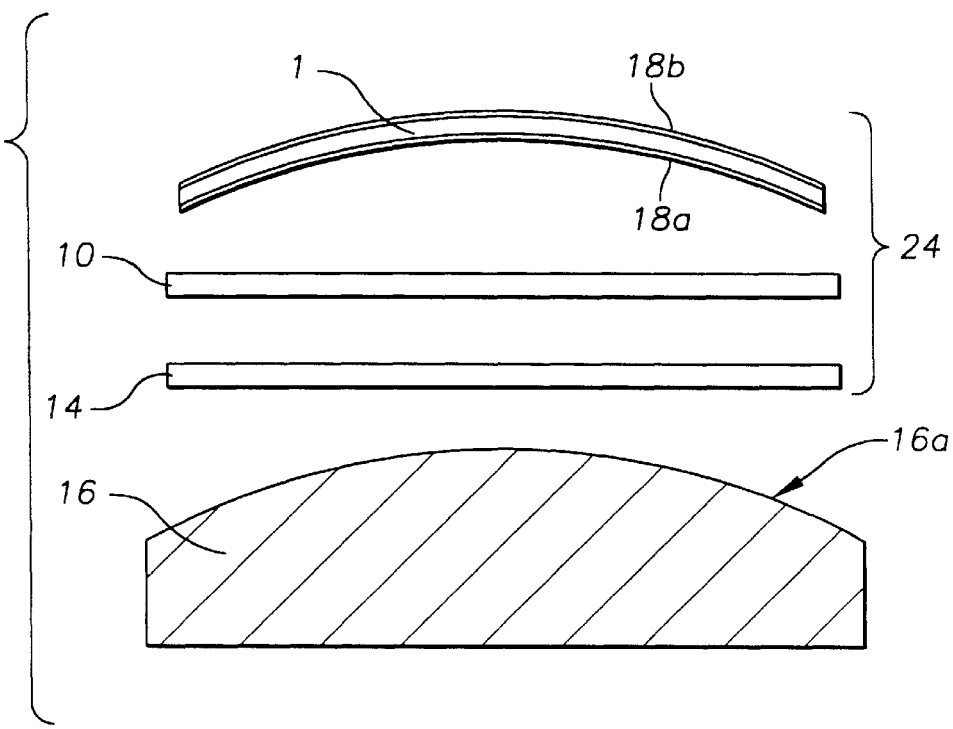
FIG. 3 is a side elevation showing the components of an actuator used in the preferred embodiment of the invention, prior to assembly of the components.
Figure 4:
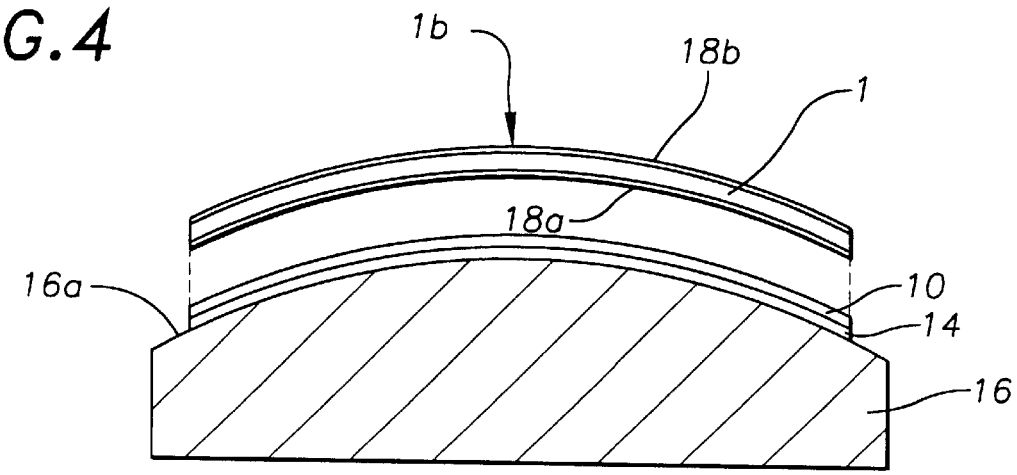
FIG. 4 is a side elevation showing the components of an actuator used in the preferred embodiment of the invention, during the manufacturing process.

With reference to FIGS. 3 & 4: In the preferred embodiment of the invention an initially flat pre-stress layer 14, preferably made of a metal such as steel, is placed adjacent a convex curved mold 16. External pressure is applied to the pre-stress layer 14 to cause it take the (curved) shape of the mold 16. The external force which is applied to the pre-stress layer 14 may, for example, be developed by creating a vacuum between the mold 16 and the pre-stress layer 14.

An adhesive layer 10, preferably made of LaRC-SI™ or similar polyimide, which may, for example, initially either be in the form of a spray, a liquid, or a thin deformable sheet, is then brushed, sprayed or disposed by another conventional method to the pre-stressing layer 14. If the adhesive layer is initially in the form of a flat, thin deformable sheet, external pressure must be applied to the adhesive layer to cause it to conform to the shape of the now-curved pre-stress layer 14, as illustrated in FIG. 4.

As discussed above the ceramic layer 1 is manufactured so as to have a normally curved shape when unstressed. In the preferred embodiment of the invention, the curvature of the ceramic layer 1 is initially substantially the same as that of the mold, such that the it may conform to the shape of the adhesive layer 10 and the pre-stress layer 14, without becoming strained, when the latter two layers are made drawn tightly against the mold 16. The initially curved ceramic layer 1 is placed adjacent the adhesive layer, as illustrated in FIG. 4. An external force is preferably applied to the exposed major surface 1b of the ceramic layer 1 to insure integrity of contact between the ceramic layer 1, the adhesive layer 10 and the pre-stress layer 14.

The stacked PZT ceramic layer 1, adhesive layer 10, and pre-stress layer 14 are then simultaneously heated to a temperature above the melting point of the adhesive material. The stacked PZT ceramic layer 1, adhesive layer 10, and pre-stress layer 14 are subsequently allowed to cool down until the adhesive material 10 re-solidifies and integrally bonds the ceramic layer 1 to the pre-stress layer 14.

Once the temperature of the stacked PZT ceramic layer 1, adhesive layer 10, and pre-stress layer 14 has dropped sufficiently low to cause the adhesive layer 10 to firmly bond the pre-stress layer 14 to the ceramic layer 1, any external pressure which may have been applied in order to hold the laminate layers together during the manufacturing process is removed. As the temperature of the stacked PZT ceramic layer 1, adhesive layer 10, and pre-stress layer 14 continues to drop (i.e. to the ambient temperature) the ceramic layer 1 becomes compressively stressed by the pre-stress layer 14 and the adhesive layer 10, due to the higher coefficient of thermal contraction of the materials of the pre-stress layer 14 and the adhesive layer 10 than for the material of the PZT ceramic layer 1. Also, due to the greater thermal contraction of the pre-stress layer 14 and the adhesive layer 10 than of the PZT ceramic layer 1, the assembled actuator 24 deforms into an arcuate shape having a smaller radius of curvature than that of the mold (and smaller than the initial radius of curvature of the initially pre-curved ceramic layer 1), as illustrated in FIG. 9.

In various modifications of the present invention one or more additional pre-stress layer(s) (not shown) may be similarly bonded to either or both sides of the ceramic layer 1 in order, for example, to increase the stress in the PZT ceramic layer 1 or to strengthen the entire actuator 24.

Electrical energy may be introduced to the actuator 24 from an electrical power supply 28 by a pair of electrical wires 30 attached to the opposite faces of the actuator 24 in communication with the electroplated 18a and 18b faces of the PZT ceramic layer 1.

It will be understood that in a flextensional transducer manufactured in accordance with the method of the present invention, an initially pre-curved ceramic layer 1 becomes permanently stressed by a pre-stress layer. This permanent pre-stressing of the ceramic layer can be effected the adhesive layer 10 and/or by the pre-stressing layer 14. That is, either the adhesive layer 10 or the pre-stress layer 14 (typically a thin metallic layer) may apply a compressive stress to the ceramic layer 1 due to the relatively higher thermal contraction coefficients of the adhesive layer 10 and the pre-stress layer 14 than that of the ceramic layer 1. Preferably, both the adhesive layer 10 and the metallic pre-stress layer 14 apply a compressive stress to the ceramic layer 1. However, as illustrated in FIG. 5, in embodiments of the present invention which comprise a (metallic) pre-stress layer 14, the adhesive layer 10 may be any adhesive that adequately bonds the ceramic layer 1 to the pre-stressing layer 14 together, regardless of the pre-stressing properties of the adhesive material, per se.

Figure 5:
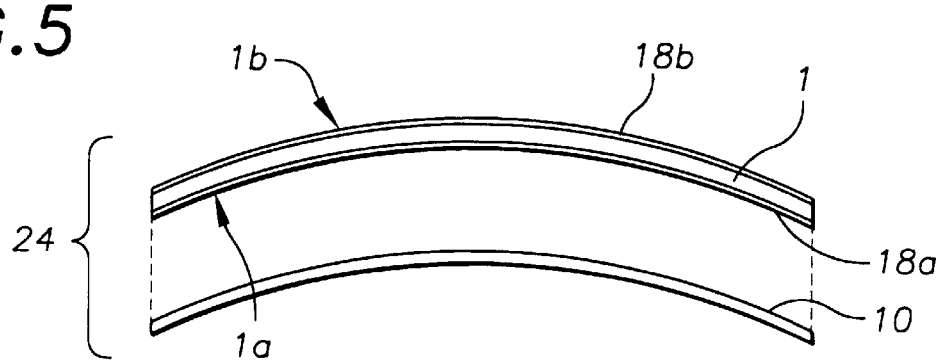
FIG. 5 is a side elevation showing the components of an actuator used in a modified manufacturing process.

As illustrated in FIG. 5, a modified embodiment of the present invention may be produced without using a separate "pre-stress layer" other than the adhesive layer itself. In this modification of the invention, the adhesive layer 10, which preferably comprises a high strength, high thermally contracting polyimide such as LaRC-SI™ or the like, is applied to the normally concave face 1a of the ceramic layer 1, and then the composite structure is heated and cooled as described above. In this modification of the invention the difference in thermal contraction rates between the adhesive layer 10 and the ceramic layer 1 causes the ceramic layer 1 to be compressively stressed.

Figure 6:
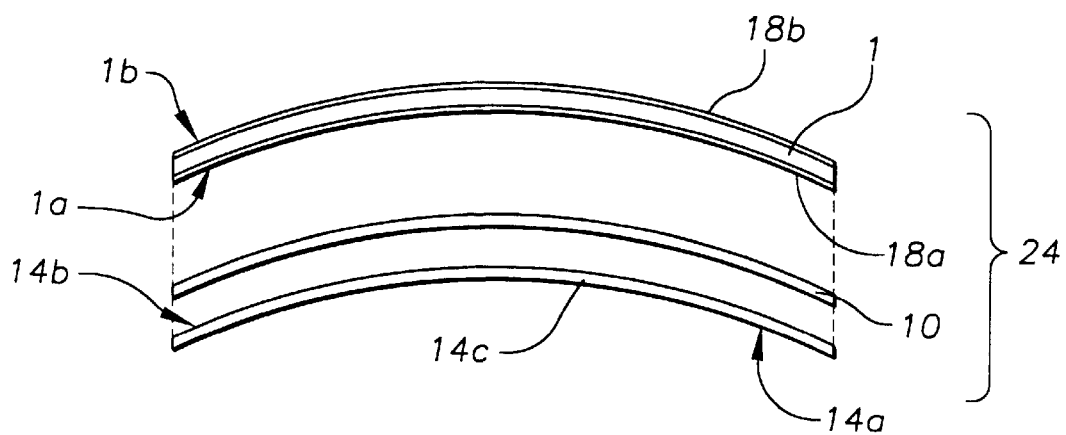
FIG. 6 is a side elevation showing the components of an actuator used in another modified manufacturing process.

Another modification of the present invention is shown in FIG. 6. In this modification of the invention an actuator is manufactured by using a pre-curved pre-stressing layer 14c, (rather than an initially flat pre-stressing layer 14 as illustrated in FIG. 3). It will be appreciated that in this modification of the invention the laminate layers (1, 10 and 14a) can be assembled together without the use of a mold. The adhesive layer 10 is applied to the normally concave face 1a of the ceramic layer 1. The normally convex face 14b of the curved pre-stress layer 14c is then placed against the adhesive layer 10. The entire actuator 24 is then heated and cooled as described above, and the difference in thermal contraction rates causes the PZT ceramic layer 1 to be compressively stressed.

Figure 7:
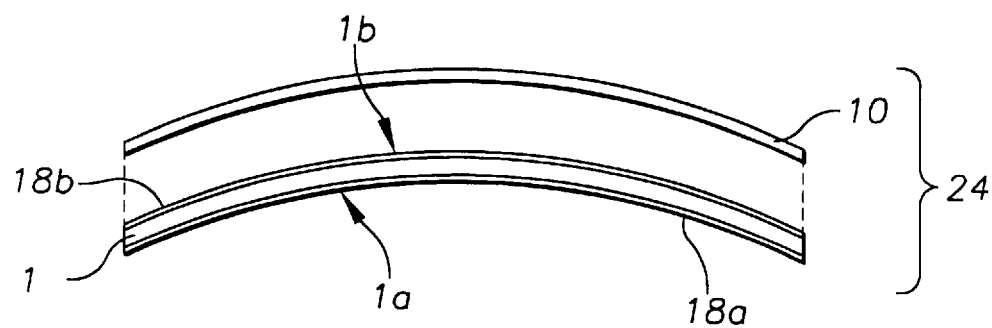
FIG. 7 is a side elevation showing the components of an actuator used in another modified manufacturing process.
Figure 10:
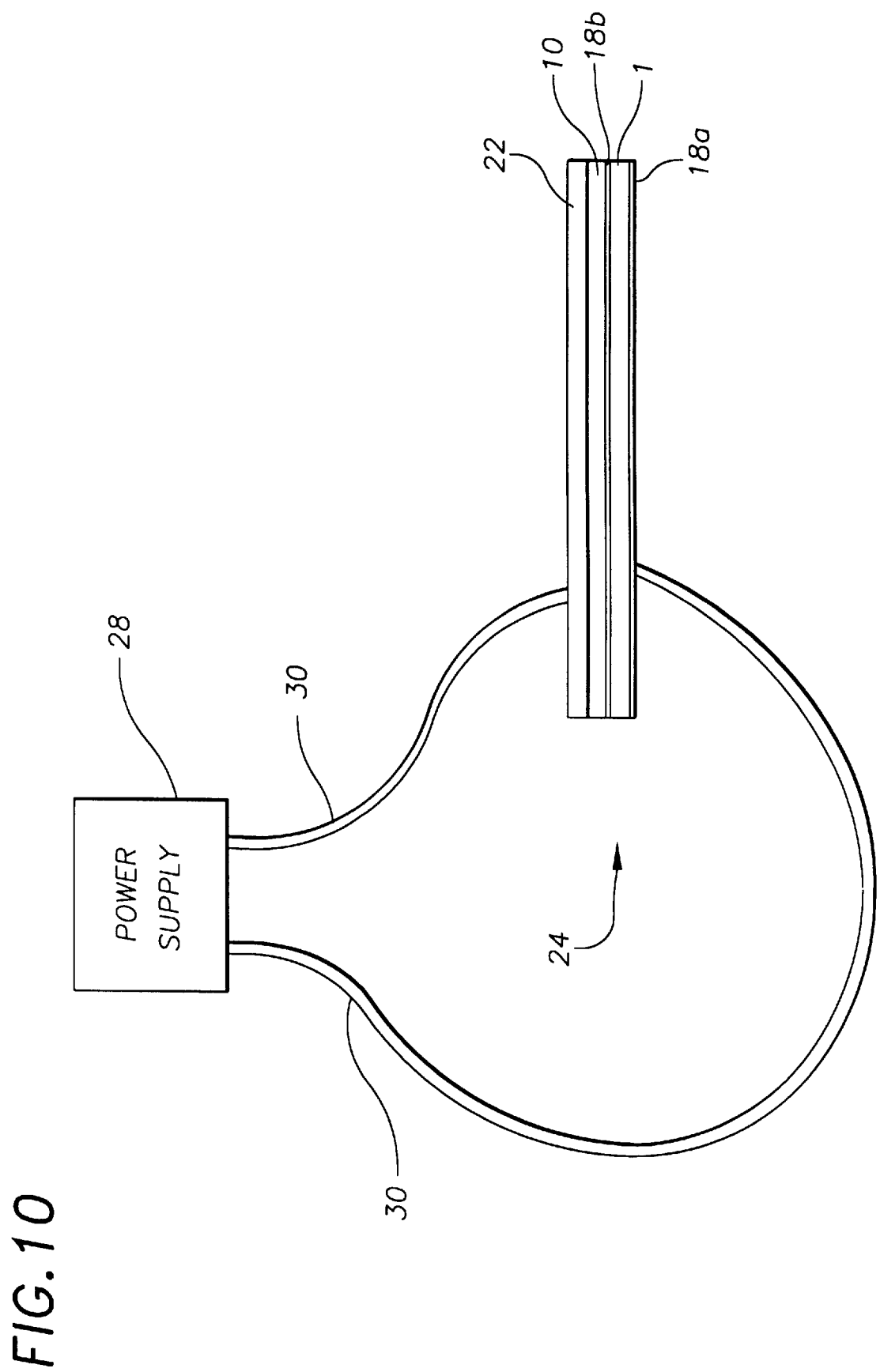

Now referring to FIG. 7: In yet another modification of the present invention the actuator 24 may be manufactured so that when the adhesive layer 10 is applied to the ceramic layer 1, the ceramic layer 1 tends to become less curved or even flatten out, (as shown in FIG. 10), than its original shape prior to manufacture. In this modification of the present invention the adhesive layer 10, which must be made of a pre-stressing material such as LaRC-SI™, is applied to the normally convex face 1b of the ceramic layer 1, and the composite 24 is heated and cooled as described above. As a result of the difference in thermal contraction rates between the adhesive material and the ceramic layer 1, the PZT ceramic layer 1 becomes compressively stressed, causing it to become less curved.

Figure 8:
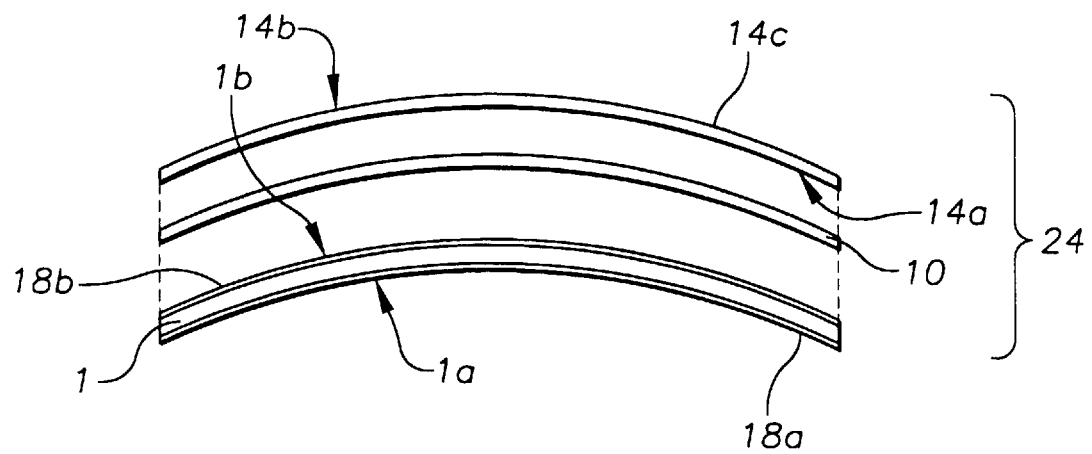
FIG. 8 is a side elevation showing the components of an actuator used in a modified manufacturing process.

In a similar modification of the invention depicted in FIG. 8, the adhesive layer 10, which can be made of any adhesive material having adequate bonding strength, is applied to the normally convex face 1b of the ceramic layer 1. The normally concave face 14a of the curved pre-stress layer 14c is then placed against the adhesive layer 10. The actuator 24 is then heated and cooled as described above, and as a result of the difference in thermal contraction rates of the pre-stress layer 14c and the ceramic layer 1, the ceramic layer 1 becomes compressively stressed, causing it to become less curved.

While the above description contains many specificities, these should not be construed as limitations on the scope of the invention, but rather as an exemplification of one embodiment and a few modifications thereof. Many other variations are possible, for example:

mold may be convex or concave;

An adhesive layer 10 may be applied to both sides of the ceramic layer 1, as opposed to only one side as described above;

A pre-stressing layer 14 or 14c may be attached to both sides of the ceramic layer 1, as opposed to only one side as described above;

Adhesives, preferably polyimides, other than LaRC-Si™, may be used to bond adjacent layers of the flextensional actuators together;

A mold 16 may still be used in those modifications using a pre-curved pre-stressing layer 14c to aid in the manufacturing process;

Accordingly, the scope of the invention should be determined not by the embodiment illustrated, but by the appended claims and their legal equivalents.

I claim:

1. A method for manufacturing a flextensional transducer comprising:

selecting an initially curved, electrically active, ceramic layer;
   said initially curved, electrically active, ceramic layer having two major faces;
   wherein one of said major faces is convex and one of said major faces is concave;

positioning an adhesive layer adjacent one of said major faces of said initially curved, electrically active, ceramic layer to create a composite structure;

heating said composite structure to a temperature above a melting point of said adhesive layer; and cooling said composite structure to induce a pre-stress into said ceramic layer.

2. The method according to claim 1, wherein said convex face and said concave face of said ceramic layer each include an electrode.

3. The method according to claim 2, wherein said initially curved, electrically active, ceramic layer is substantially unstressed prior to said step of heating said composite structure.

4. The method according to claim 3, further comprising:

prior to said step of heating said composite structure positioning a bottom surface of a pre-stress layer adjacent said adhesive layer.

5. The method according to claim 4, wherein said adhesive layer is positioned adjacent said convex face of said initially curved, electrically active, ceramic layer.

6. The method according to claim 4, wherein said adhesive layer is positioned adjacent said concave face of said initially curved, electrically active, ceramic layer.

7. The method according to claim 6, wherein said initially curved, electrically active, ceramic layer comprises a spheric segment prior to said step of heating said ceramic structure.

8. The method according to claim 6, wherein said initially curved, electrically active, ceramic layer comprises a piezoelectric material.

9. A flextensional transducer manufactured by a process which comprises:

selecting an initially curved, electrically active, ceramic layer;
   said initially curved, electrically active, ceramic layer having two major faces;
   wherein one of said major faces is convex and one of said major faces is concave;

positioning an adhesive layer adjacent one of said major faces of said initially curved, electrically active, ceramic layer to create a composite structure;

heating said composite structure to a temperature above a melting point of said adhesive layer; and cooling said composite structure to induce a pre-stress into said ceramic layer.

10. The invention according to claim 9, wherein said convex face and said concave face of said ceramic layer each include an electrode.

11. The invention according to claim 10, wherein said initially curved, electrically active, ceramic layer is substantially unstressed prior to said step of heating said composite structure.

12. The invention according to claim 11, further comprising:

prior to said step of heating said composite structure positioning a bottom surface of a pre-stress layer adjacent said adhesive layer.

13. The invention according to claim 12, wherein said adhesive layer is positioned adjacent said convex face of said initially curved, electrically active, ceramic layer.

14. The invention according to claim 12, wherein said adhesive layer is positioned adjacent said concave face of said initially curved, electrically active, ceramic layer.

15. The invention according to claim 14, wherein said initially curved, electrically active, ceramic layer comprises a spheric segment prior to said step of heating said ceramic structure.

16. The invention according to claim 15, wherein said initially curved, electrically active, ceramic layer comprises a piezoelectric material.

* * * * *